US010319582B2

(12) United States Patent
Varadarajan et al.

(10) Patent No.: US 10,319,582 B2
(45) Date of Patent: Jun. 11, 2019

(54) METHODS AND APPARATUS FOR DEPOSITING SILICON OXIDE ON METAL LAYERS

(71) Applicant: Lam Research Corporation, Fremont, CA (US)

(72) Inventors: Bhadri N. Varadarajan, Beaverton, OR (US); Zhe Gui, Beaverton, OR (US); Bo Gong, Sherwood, OR (US); Andrew John McKerrow, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 19 days.

(21) Appl. No.: 15/499,318

(22) Filed: Apr. 27, 2017

(65) Prior Publication Data

US 2018/0315597 A1    Nov. 1, 2018

(51) Int. Cl.
*H01L 21/02* (2006.01)
*H01L 21/027* (2006.01)

(52) U.S. Cl.
CPC .... *H01L 21/02167* (2013.01); *H01L 21/0228* (2013.01); *H01L 21/02068* (2013.01); *H01L 21/0274* (2013.01); *H01L 21/02164* (2013.01); *H01L 21/02208* (2013.01)

(58) Field of Classification Search
None
See application file for complete search history.

(56) References Cited

U.S. PATENT DOCUMENTS

| | | | |
|---|---|---|---|
| 4,985,371 A * | 1/1991 | Rana | H01L 21/32051 257/E21.295 |
| 8,084,339 B2 | 12/2011 | Antonelli et al. | |
| 8,217,513 B2 | 7/2012 | Antonelli et al. | |
| 9,234,276 B2 | 1/2016 | Varadarajan et al. | |
| 2003/0176080 A1 * | 9/2003 | Fu | C23C 16/325 438/778 |

(Continued)

OTHER PUBLICATIONS

U.S. Appl. No. 15/195,539, filed Jun. 28, 2016, Rainville et al.

(Continued)

*Primary Examiner* — Eva Y Montalvo
*Assistant Examiner* — Kevin Quinto
(74) *Attorney, Agent, or Firm* — Weaver Austin Villeneuve & Sampson LLP

(57) ABSTRACT

Thin layer of silicon oxide is deposited on a substrate having an exposed layer of metal (e.g., W, Cu, Ti, Co, Ta) without causing substantial oxidation of the metal. The method involves: (a) contacting the substrate having an exposed metal layer with a silicon-containing precursor and adsorbing the precursor on the substrate; (b) removing the unadsorbed precursor from a process chamber; and (c) contacting the adsorbed precursor with a plasma formed in a process gas comprising an oxygen source (e.g., $O_2$, $CO_2$, $N_2O$, $O_3$) and $H_2$, to form silicon oxide from the silicon-containing precursor while suppressing metal oxidation. These steps can be repeated until a silicon oxide film of a desired thickness is formed. In some embodiments, the silicon oxide film is used to improve nucleation of subsequently deposited silicon carbide.

18 Claims, 9 Drawing Sheets

(56) References Cited

U.S. PATENT DOCUMENTS

| | | | |
|---|---|---|---|
| 2005/0260860 A1* | 11/2005 | Lee, II | G03F 7/2024 |
| | | | 438/725 |
| 2006/0032442 A1* | 2/2006 | Hasebe | C03C 17/245 |
| | | | 118/715 |
| 2010/0084626 A1* | 4/2010 | Delhougne | H01L 27/2436 |
| | | | 257/4 |
| 2012/0146113 A1* | 6/2012 | Suzuki | C23C 16/0236 |
| | | | 257/288 |
| 2017/0032975 A1* | 2/2017 | Tai | H01L 29/517 |

OTHER PUBLICATIONS

U.S. Appl. No. 15/279,310, filed Sep. 28, 2016, van Schravendijk et al.
U.S. Appl. No. 15/282,543, filed Sep. 30, 2016, Reddy et al.

* cited by examiner

METHODS AND APPARATUS FOR DEPOSITING SILICON OXIDE ON METAL LAYERS

FIELD OF THE INVENTION

This invention pertains to methods of semiconductor substrate processing. Specifically, this invention pertains to methods of depositing silicon oxide layers over layers of metal during semiconductor device fabrication.

BACKGROUND

Fabrication of semiconductor devices often involves deposition of layers of dielectric over layers of metal. Examples of such dielectric layers include encapsulation layers for memory stacks, as well as various diffusion barrier layers, and etch stop layers. Silicon carbide (SiC) is one of the preferred dielectric materials for such applications. Classes of SiC thin films include oxygen doped silicon carbide, also known as silicon oxycarbide, nitrogen doped silicon carbide, also known as silicon nitricarbide, and oxygen and nitrogen doped silicon carbide, also known as silicon oxynitricarbide, and undoped silicon carbide. Silicon carbide is typically deposited by chemical vapor deposition (CVD), such as by plasma enhanced chemical vapor deposition (PECVD).

SUMMARY

Silicon carbide often needs to be deposited on a substrate having an exposed layer of metal and an exposed dielectric, where the surface of the substrate comprises a plurality of recessed features. It was determined that deposition of silicon carbide over metal often occurs with a nucleation delay relative to deposition over the dielectric on the same substrate, resulting in non-uniform thickness of the deposited silicon carbide layer, or in an inadequate silicon carbide coverage (or no coverage) of the metal. This effect is particularly harmful, when the target thickness of silicon carbide layer is relatively small, such as 2 nm or less. In this case nucleation delay over metal can lead to lack of silicon carbide coverage over metal, and, consequently, to impacted functionality of the silicon carbide layer.

This problem is addressed herein by depositing a thin layer of silicon oxide onto the substrate prior to deposition of the silicon carbide layer. Silicon oxide deposited both over metal and dielectric reduces or eliminates the nucleation delay and allows for conformal deposition of silicon carbide layers of various thicknesses.

In one aspect, a method for processing a semiconductor substrate is provided, wherein the method includes: (a) providing a semiconductor substrate comprising an exposed metal layer and an exposed dielectric layer; (b) depositing a layer of silicon oxide onto both the exposed metal layer and the exposed dielectric layer; and (c) depositing a silicon carbide layer onto the silicon oxide layer. In some embodiments, the substrate provided in (a) has a plurality of recessed features, and silicon oxide layer is deposited conformally by atomic layer deposition (ALD). The method can be used for improving silicon carbide coverage on a variety of metals, including W, Cu, Co, Ti, and Ta. In one example, the method is implemented on a substrate having an exposed W layer and a plurality of recessed features. In some embodiments, the silicon oxide layer is relatively thin, such as less than about 50 Å, e.g., between about 5-10 Å.

While in general, silicon oxide can be deposited by any suitable method, it is highly preferable to form silicon oxide over the metal, while suppressing metal oxidation. Methods are herein provided that allow deposition of silicon oxide without causing oxidation of metal layers onto which the silicon oxide is deposited. This is a significant advantage of provided methods, since oxidation of metal leads to increased resistance of metal lines, and, consequently, to an undesired increase in resistance-capacitance (RC) delay, which is unwanted.

According to another aspect of the invention, a method for processing a semiconductor substrate is provided, wherein the method involves: (a) providing a semiconductor substrate comprising an exposed metal layer (e.g., W, Cu, Co, Ti, Ta); and (b) forming a silicon oxide layer over and in contact with the metal layer, wherein forming the silicon oxide layer comprises reacting a silicon-containing precursor adsorbed to the metal layer with a plasma formed in a process gas comprising $H_2$ and an oxygen source (e.g., $O_2$, $O_3$, $CO_2$, $N_2O$), wherein the composition of the process gas is configured for suppressing oxidation of the metal layer. In some implementations the formed silicon oxide layer has a thickness of less than about 10 Å, such as about 5 Å. This method can be used for depositing silicon oxide prior to silicon carbide deposition, as provided in the previous aspect of the invention, or, independently, for any other processing sequence that requires deposition of silicon oxide over metal.

In some embodiments, the composition of the process gas is configured for suppressing oxidation of metal by using a relatively high ratio of $H_2$ to an oxygen source. In some embodiments the volume ratio of $H_2$ to the oxygen source in the process gas is at least about 4:1. In some implementations, the oxygen source is $O_2$, and the volume ratio of $H_2$ to $O_2$ in the process gas is at least about 4:1, such as at least about 9:1, such as at least about 10:1, and in the embodiments where the gas consists essentially of $H_2$ and $O_2$, the ratio is at least about 96:1 such as at least about 100:1. In one embodiment the process gas consists essentially of $H_2$, $O_2$ and an inert gas (e.g., He), where the concentration of $H_2$ is between about 2-10% by volume, and concentration of $O_2$ is less than about 1% by volume. For example, in this embodiment the $H_2$ to $O_2$ volume ratio should be preferably at least about 4:1. In another implementation the process gas consists essentially of $H_2$ and $O_2$, where the concentration of $H_2$ is greater than about 95% by volume, and concentration of $O_2$ is less than about 5% by volume (e.g., 0.1-4.5% by volume)

In some embodiments forming the silicon oxide layer involves: (i) contacting the semiconductor substrate with the silicon-containing precursor and adsorbing the silicon-containing precursor onto the layer of metal; (ii) removing the unadsorbed silicon-containing precursor by purging and/or evacuating a process chamber housing the semiconductor substrate; (iii) contacting the semiconductor substrate with the plasma formed in the process gas comprising $H_2$ and the oxygen source and forming silicon oxide from the adsorbed silicon-containing precursor; (iv) purging and/or evacuating the process chamber after (iii); and (v) repeating steps (i)-(iv) until silicon oxide film of a desired thickness is deposited. In some embodiments, the method further involves pre-cleaning the exposed metal to remove any metal oxide that may be present on the metal surface prior to forming silicon oxide. Further, in some embodiments, the method further may include contacting the semiconductor substrate having an exposed silicon oxide layer after silicon oxide has been formed with a reducing plasma (e.g., hydrogen plasma) to reduce residual metal oxide that underlies silicon oxide layer to metal.

In some implementations the silicon oxide layer is formed on a substrate having both exposed metal surfaces and exposed dielectric surfaces, and the deposition occurs on both types of surfaces. In one process flow, a silicon carbide layer is then deposited onto the silicon oxide layer.

All provided methods can be integrated with photolithographic processing schemes, and may further include: applying photoresist to the semiconductor substrate; exposing the photoresist to light; patterning the photoresist and transferring the pattern to the semiconductor substrate; and selectively removing the photoresist from the semiconductor substrate.

According to another aspect, an apparatus configured for forming a silicon oxide film on a substrate having an exposed metal layer is provided. In one embodiment the apparatus includes a process chamber having a support for holding the semiconductor substrate, a system for generating a plasma and a controller. The controller includes program instructions for conducting any of the methods provided herein. In some embodiments, the controller is programmed for: forming a silicon oxide layer over and in contact with the exposed metal layer, wherein forming the silicon oxide layer comprises reacting a silicon-containing precursor adsorbed to the metal layer with a plasma formed in a process gas comprising $H_2$ and an oxygen source (e.g., $O_2$, $O_3$, $CO_2$, $N_2O$), wherein the composition of the process gas is configured for suppressing oxidation of the metal layer.

According to another aspect, an apparatus configured for depositing silicon carbide on a substrate having an exposed metal layer and an exposed dielectric layer is provided. The apparatus includes one or more process chambers configured for housing the substrate, and a controller having program instructions for: (a) depositing a layer of silicon oxide onto both the exposed metal layer and the exposed dielectric layer; and (b) depositing a silicon carbide layer onto the silicon oxide layer. In some embodiments the apparatus is configured for depositing silicon oxide and silicon carbide in the same chamber of one tool. In other embodiments deposition can be performed in different chambers.

According to another aspect, a system is provided herein which includes any of the apparatuses provided herein and a stepper.

According to another aspect, a non-transitory computer machine-readable medium is provided. It includes program instructions for control of a deposition apparatus, and can include code for performing any of the methods provided herein. In some embodiments code is provided for: (a) depositing a layer of silicon oxide onto both the exposed metal layer and the exposed dielectric layer on a substrate; and (b) depositing a silicon carbide layer onto the silicon oxide layer. In some embodiments code is provided for: forming a silicon oxide layer over and in contact with the exposed metal layer, wherein forming the silicon oxide layer comprises reacting a silicon-containing precursor adsorbed to the metal layer with a plasma formed in a process gas comprising $H_2$ and an oxygen source (e.g., $O_2$, $O_3$, $CO_2$, $N_2O$), wherein the composition of the process gas is configured for suppressing oxidation of the metal layer.

According to another aspect a semiconductor device is provided, wherein the semiconductor device comprises: (a) a metal layer and a dielectric layer; (c) a silicon oxide layer contacting both the metal layer and the dielectric layer; and (c) a silicon carbide layer contacting the silicon oxide layer at a surface that is opposite to the surface contacting the metal layer and the dielectric layer. In some embodiments, the thickness of the silicon oxide layer is less than about 50 Å.

These and other features and advantages of the present invention will be described in more detail below with reference to the associated drawings.

DETAILED DESCRIPTION

Figure 1A:
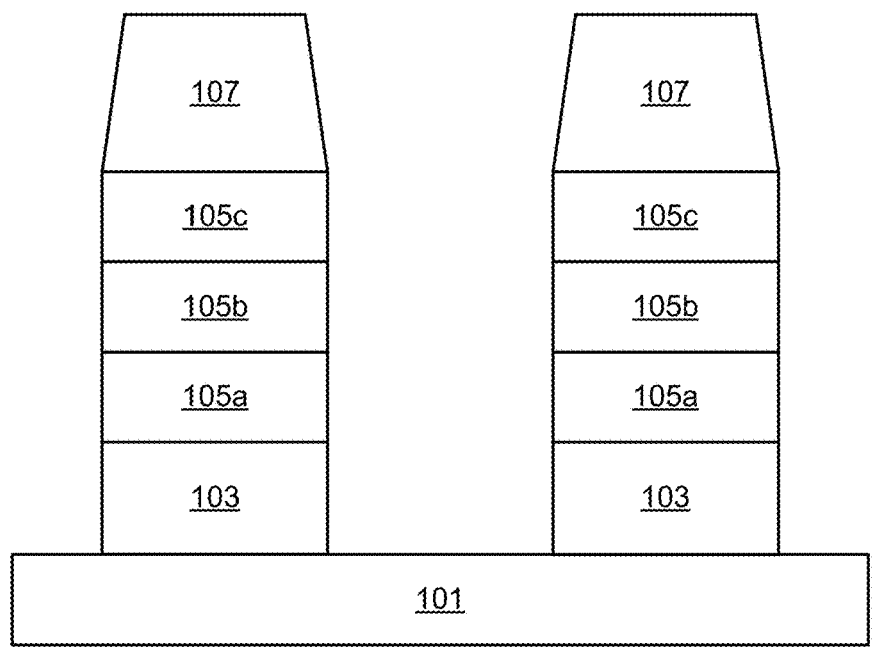
FIGS. 1A-1C show cross-sectional views of a semiconductor substrate during processing, illustrating an embodiment provided herein.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this description, the terms "semiconductor wafer," "semiconductor substrate", "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description describes deposition of silicon oxide layers on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like. The term "semiconductor wafer" or "semiconductor substrate" used herein refers to a substrate that has semiconductor material anywhere within its body, and it is understood that the semiconductor material does not need to be exposed. In many embodiments the semiconductor substrate includes one or more dielectric and conductive layers formed over the semiconductor material. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes.

The silicon oxide films provided herein contain Si and O. While other elements (e.g., C and N) may be present in the films, in many embodiments the films consist essentially of Si and O, and, optionally, H, and contain no more than 10 atomic % (and in some embodiments no more than 5 atomic %) of other elements.

The silicon carbide films provided herein include both doped and undoped silicon carbide, such as SiC, SiCN, SiCNO, and SiCO of varying stoichiometries (the formulas indicate elemental composition but stoichiometry can vary). Hydrogen may be optionally present in any of the silicon carbide films (e.g., SiC, SiCN, SiCNO, and SiCO films).

The term "atomic layer deposition" (ALD) as used herein is inclusive of plasma assisted atomic layer deposition, and refers to deposition methods which primarily rely on reactions on the surface of the substrate rather than in the bulk of the process chamber.

According to one aspect, a method for processing a semiconductor substrate is provided, where the method allows for depositing silicon carbide films conformally and uniformly over a substrate having an exposed layer of metal and an exposed layer of dielectric. For example, the exposed dielectric layer can include silicon nitride, silicon oxide, low-k dielectric, ultra low-k dielectric, organic and/or porous dielectric, metal oxide, etc. The exposed metal layer may include a variety of metals, such as W, Ti, Ta, Co, and Cu. In some embodiments, the substrate may also include exposed semiconductor, or a different type of material, e.g., silicon (including polycrystalline silicon), germanium, GeSi, etc. Generally, the exposed surface of the substrate may be planar or may include recessed features. The methods provided herein are particularly advantageous for substrates having recessed features, because they allow for conformal deposition of silicon carbide, even when very thin layers need to be deposited. Provided methods can be used for depositing silicon carbide films having a variety of thicknesses (e.g., 20-400 Å), and are particularly advantageous for depositing thin silicon carbide films (e.g., 20-100 Å thick films).

Figure 1B:
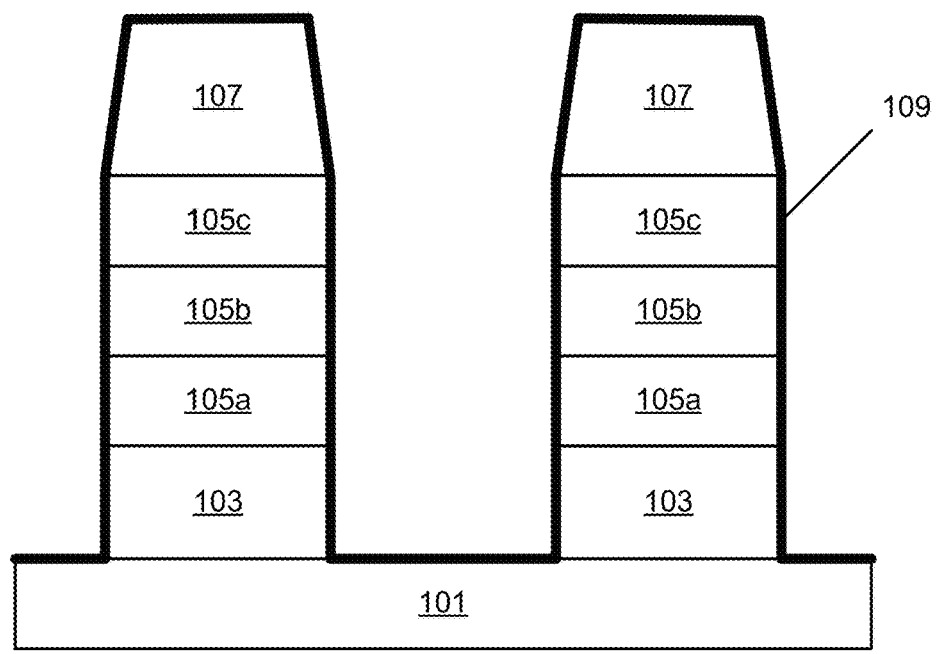
Figure 1C:
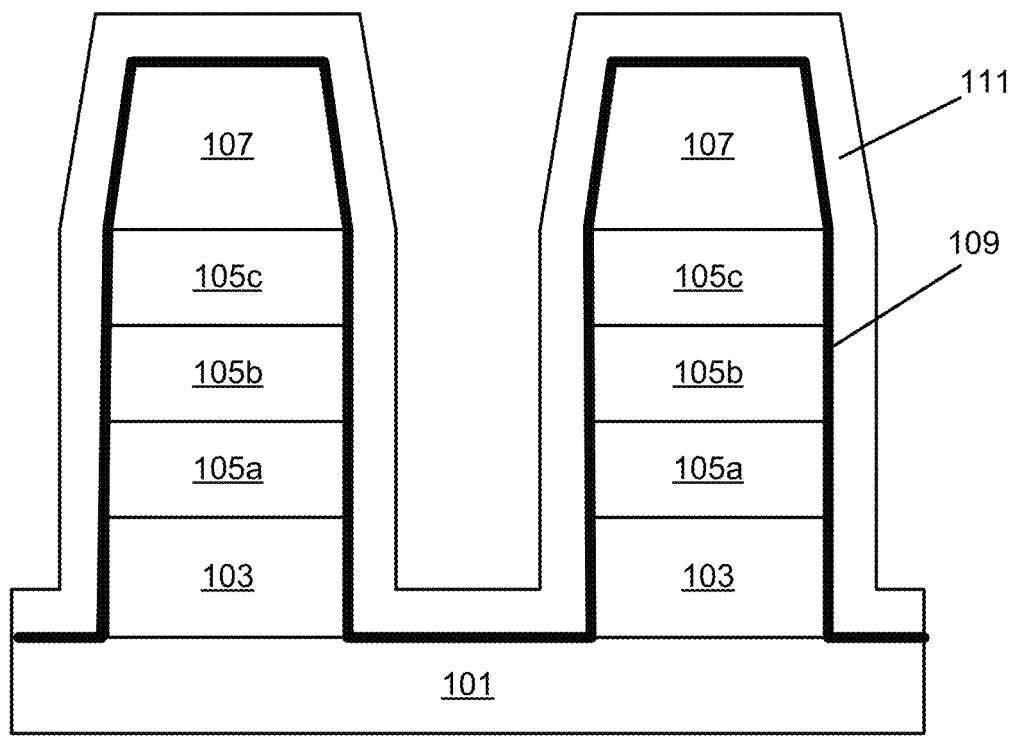
Figure 2:
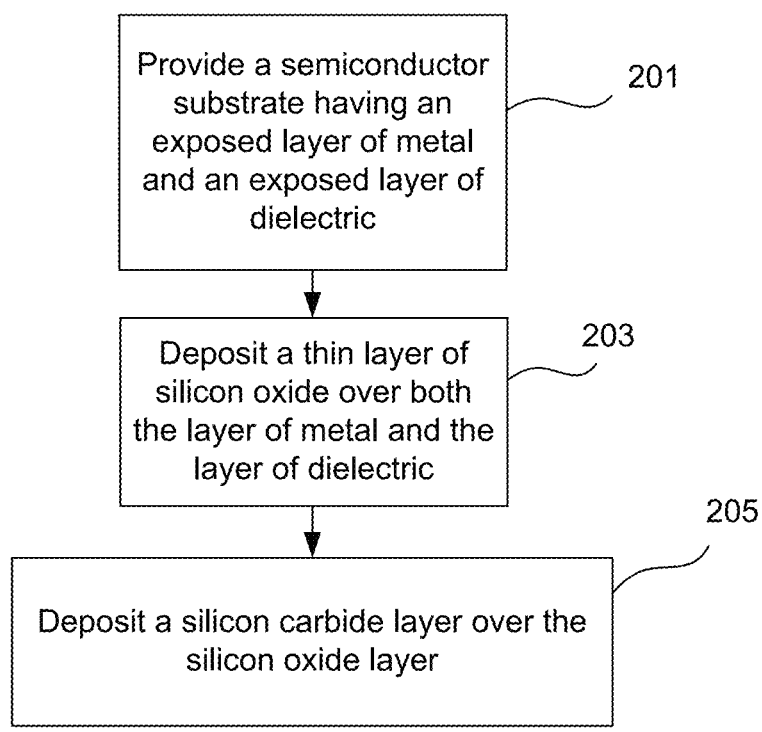
FIG. 2 is a process flow diagram for a processing method provided herein.

FIGS. 1A-1C provide an example of a substrate, undergoing processing according to the methods provided herein. Schematic cross-sectional views of the substrate at different stages of processing are shown. FIG. 2 provides a process flow diagram for the processing method depicted by structures of FIGS. 1A-1C. Referring to FIG. 2, the process starts in 201 by providing a substrate having an exposed layer of dielectric and an exposed layer of metal. FIG. 1A illustrates a semiconductor substrate, e.g., a partially fabricated magnetoresistive random access memory (MRAM) device, that has an exposed metal layer and an exposed dielectric layer. The illustrated substrate has a recessed feature between two stacks of materials, where the stacks of materials may include magnetic materials, dielectric materials, conductive materials, etc. The stacks may include a plurality of layers (layers 103, $105_{a-c}$, and 107), formed on an exposed layer 101. In one embodiment, the semiconductor substrate includes an exposed dielectric layer 107 (e.g., a silicon nitride layer), and an exposed metal layer $105_b$ (e.g., a tungsten layer). The stacks may reside on a layer of polycrystalline silicon 101.

Next, in operation 203, the process follows by depositing a thin layer of silicon oxide over both the metal layer and the dielectric layer. In one of the preferred embodiments the silicon oxide is conformally deposited by ALD, and involves adsorbing a silicon-containing precursor onto the substrate, and reacting it with an oxygen-containing reactant to form silicon oxide. More preferably, silicon oxide is deposited by ALD using methods configured for suppressing metal oxidation, as provided herein. In some embodiments silicon oxide is deposited to a thickness of between about 5-30 Å, such as to a thickness of about 5 Å. The resulting structure is shown in FIG. 1B, where the layer of silicon oxide 109 conformally coats the surface of the substrate, including the dielectric layer 107, the metal layer $105_b$, and all other previously exposed layers of the substrate.

Next, in operation 205, a silicon carbide layer is deposited over the silicon oxide layer. Referring to FIG. 1C, the silicon carbide layer 111 deposited over and in contact with the silicon oxide layer 109, is shown. Silicon carbide in some embodiments is deposited to a thickness of between about 50 Å and about 500 Å. For example, an encapsulation layer deposited over an MRAM stack may have a thickness between about 150 Å and about 300 Å. Silicon carbide can be deposited, for example, by PECVD or ALD. In some implementations silicon carbide is deposited using methods described in U.S. patent application Ser. No. 15/279,310 filed Sep. 28, 2016, naming van Schravendijk et al. as inventors and titled "Methods of Encapsulation", or using methods described in U.S. Pat. No. 9,234,276 issued on Jan. 12, 2016 to Varadarajan et al., and titled "Method to Obtain SiC Class of Films of Desired Composition and Film Properties", which are herein incorporated by reference for all purposes and in their entireties. In one illustrative embodiment, the method of depositing silicon carbide involves providing a substrate and flowing a first organo-silicon precursor and a second, different, organo-silicon precursor onto the substrate together. For example, the precursors may include different ratios of silicon-carbon bonds. The method further involves providing one or more radicals in a substantially low energy state from a source gas, where the radicals react with the first and second organo-silicon precursors to form silicon carbide on a substrate. The radicals can be formed by exposing a source gas (e.g., hydrogen) to a remote plasma.

In a separate aspect of the invention, a method of depositing silicon oxide onto the layer of metal while suppressing metal oxidation is provided. This method can be used for depositing silicon oxide in the process illustrated in FIG. 2, or, independently, in any application, where formation of silicon oxide over metal with little or no accompanying metal oxidation is desired. The process involves: providing a semiconductor substrate comprising an exposed metal layer; and forming a silicon oxide layer over and in contact with the metal layer, wherein forming the silicon oxide layer comprises reacting a silicon-containing precursor adsorbed to the metal layer with a plasma formed in a process gas comprising $H_2$ and an oxygen source, wherein the composition of the process gas is configured for suppressing oxidation of the metal layer. For example the ratio of $H_2$ to the oxygen source in the process gas can be selected such as to minimize or eliminate oxidation of metal, while still enabling conversion of the silicon-containing precursor to silicon oxide. In some embodiments, the oxygen source is $O_2$, which is provided in the process gas at a concentration of between about 0.01-5%, such as between about 0.01-4.5%. In addition, the method may optionally include pre-treatment and post-treatment operations configured for reducing any metal oxide that might be present to metal.

Figure 3:
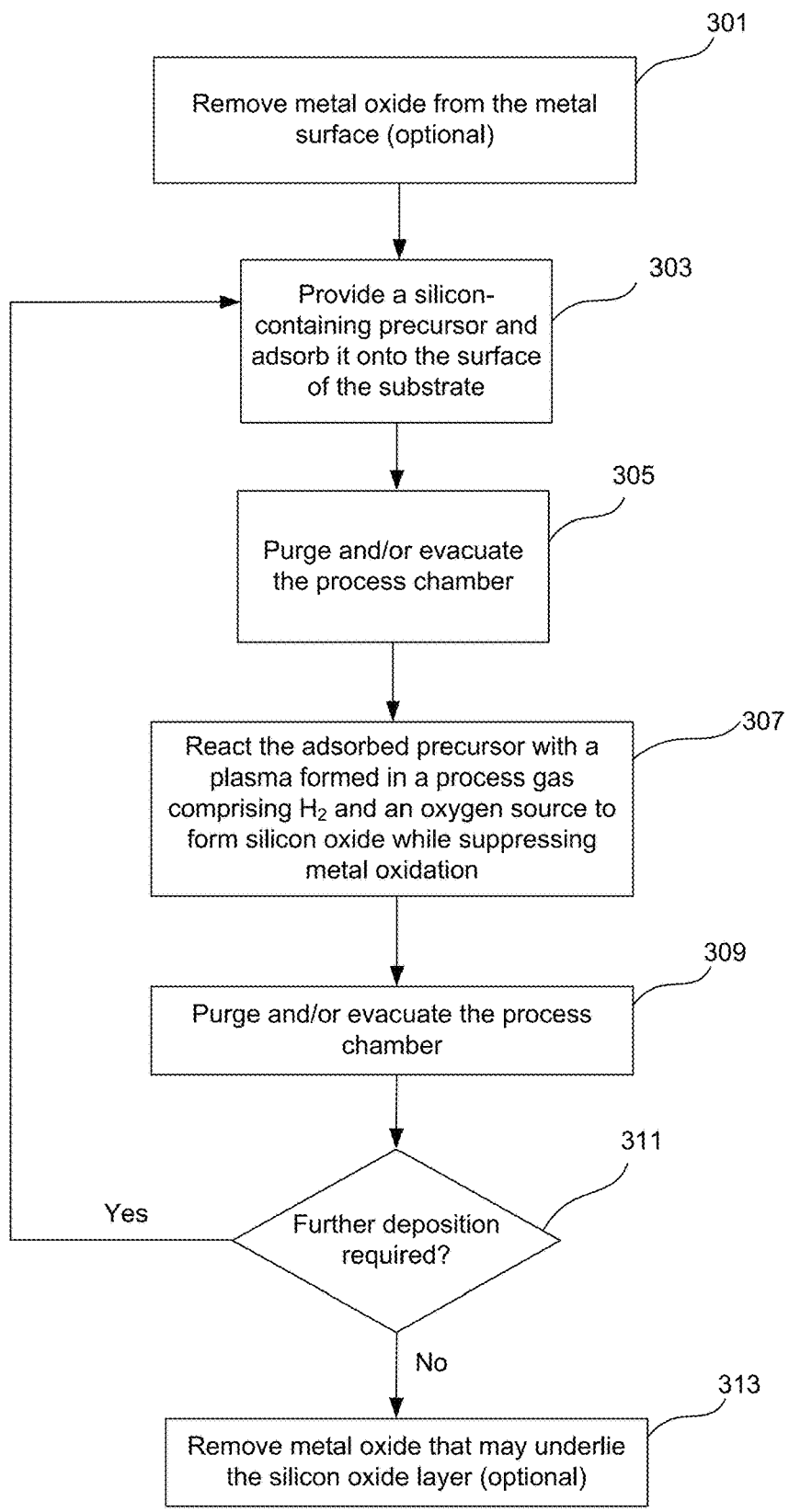
FIG. 3 is a process flow diagram for a method of depositing silicon oxide according to an embodiment provided herein.

A variety of silicon-containing precursors and oxygen sources can be used for silicon oxide deposition. Examples of suitable silicon-containing precursors include, without limitation, aminosilanes (including alkylaminosilanes), and halogen-substituted silanes (e.g., chlorosilanes), etc. Examples of aminosilane precursors include tris(dimethylamino)silane (TDMAS), bis(diethylamino)silane (BDEAS), bis(tertiarybutylamino)silane (BTBAS). Examples of oxygen sources include $O_2$, $O_3$, $CO_2$, and $N_2O$. In one example, the oxygen source is $O_2$ and the silicon-containing precursor is an aminosilane, such as bis(dimethylamino)methylsilane A process flow diagram for an example of such silicon oxide forming process is shown in FIG. 3. First, a substrate is provided, where the substrate contains an exposed layer of metal (e.g., W, Ti, Ta, Co, Cu, etc.). In some embodiments the substrate may further include a layer of dielectric (such as in a substrate shown in FIG. 1A) or of another class of materials. In other embodiments, the metal layer is the only exposed layer of material on the substrate. The substrate may have a planar surface or may include a plurality of recessed features. The process may be performed at a wide temperature range, e.g., at temperatures of between about 50-500° C., such as between about 50-400° C.

In an optional step 301, the substrate is pre-cleaned to remove metal oxide from the surface of the metal. For example, tungsten oxide can be reduced to tungsten on the surface of tungsten, by treating the substrate with a reducing plasma. For example the substrate may be treated with a plasma formed in a process gas comprising a hydrogen source (e.g., $H_2$). In some embodiments the substrate is treated with a plasma formed in a process gas consisting essentially of $H_2$ (or consisting essentially of hydrogen and an inert gas). During this treatment, the metal oxide on the metal surface is reacted with the plasma and is removed (e.g., by being reduced to metal). Such plasma treatment can be performed by direct plasma (plasma formed in the same compartment that houses the substrate) or by a remote plasma (plasma formed in a different compartment and fed into the compartment housing the substrate). In one example tungsten oxide residing on the surface of tungsten is removed by treating the substrate with a direct plasma formed in a process gas consisting essentially of $H_2$.

Next, silicon oxide deposition begins. The substrate is positioned in the process chamber that is configured for sequentially receiving reagents in gaseous (e.g., vaporized) form, such as in an ALD process chamber. In operation 303, a silicon-containing precursor is provided to the process chamber and is adsorbed onto the surface of the substrate, including the surface of the exposed metal layer. In some embodiments the silicon-containing precursor is flowed into the process chamber with an inert carrier gas, such as helium. In one example, an aminosilane is flowed into the process chamber in a mixture with helium. The flow rate of such mixture in some implementations is between about 100-1,000 sccm, with the flow rate of the silicon-containing precursor of between about 5-100 sccm. The temperature and pressure for this step are selected such as to enable adsorption of the precursor on the surface of the substrate. In some embodiments, the pressure is between about 1-7 torr. Next, after the silicon-containing precursor has adsorbed, the process chamber is purged and/or evacuated in operation 305 to remove unadsorbed silicon-containing precursor from the process chamber, while leaving a layer of adsorbed precursor on the substrate. For example an inert gas, such as helium, argon, or nitrogen may be introduced into the process chamber for purging. In the next step 307, the adsorbed silicon-containing precursor is contacted with a plasma formed in a process gas comprising $H_2$ and an oxygen source to form silicon oxide while suppressing oxidation of the metal onto which the silicon-containing precursor is adsorbed. In some embodiments, oxidation is suppressed by selecting a sufficiently high ratio of $H_2$ to the oxygen source. For example, in some embodiments the ratio of $H_2$ to the oxygen source is at least about 4:1 by volume. In one implementation the oxygen source is $O_2$ and the ratio of $H_2$ to $O_2$ is at least about 9:1. For example, the process gas may consist essentially of $H_2$, $O_2$ and an inert gas, where the concentration of $H_2$ is about 2-10% by volume and the concentration of $O_2$ is less than about 1% by volume. In one example, the process gas consists of $O_2$ (flowed at a flow rate of 5-20 sccm), $H_2$ (flowed at a flow rate of about 200 sccm), and He (flowed at a flow rate of about 9,800 sccm). In another example, the process gas consists essentially of $H_2$ (at a concentration of greater than 95% by volume) and $O_2$ (at a concentration of less than about 5% by volume). In some embodiments, the plasma is formed directly in the process chamber or process chamber compartment that houses the substrate. In other embodiments, the plasma is formed in the process gas remotely in a compartment that is different from the compartment that is housing the substrate and is then delivered to the compartment housing the substrate. In some embodiments the plasma is formed using a frequency in a range of between about 2.45-13.56 MHz, and using a power in a range of between about 2-6 kW. In one example, the plasma is formed in a process gas containing $H_2$, $O_2$, and, optionally, an inert gas using a frequency of 13.56 MHz and a power of 3 kW. In some embodiments the pressure used in this reaction step is less than about 2 Torr, such as 1.5 Torr or less. Such low pressure is associated with higher deposition rate.

Next, in operation 309, the process chamber is purged and/or evacuated to remove the process gas species, and it is determined in operation 311, whether further deposition of silicon oxide is required. In some embodiments, a single cycle containing operations 303-309 deposits on overage about 0.7-1.0 Å of material. If it is determined that more silicon oxide is needed to be deposited the cycle is repeated as many times as necessary to deposit silicon oxide to a desired thickness. In some embodiments, the cycle is performed 1-100 times, such as 1-10 times. The deposited layer is in some embodiments very thin, such as less than about 10 Å thick, e.g., is about 5 Å thick. For example, silicon oxide layers that are about 5-10 Å thick are preferred for preventing nucleation delay of silicon carbide layers.

Next, in operation 313, an optional step may be performed to remove any metal oxide that may underlie the layer of silicon oxide. Although the deposition cycles are configured for suppressing metal oxidation, in some instances metal oxide may inadvertently form, and may need to be removed (reduced to metal) by treating the substrate with hydrogen plasma (plasma formed in a gas consisting essentially of hydrogen without added oxidative species). Treatment with hydrogen plasma will penetrate the thin exposed layer of silicon oxide and will reduce the metal oxide that underlies silicon oxide without affecting the quality of silicon oxide layer. In one illustrative example, plasma treatment is performed using remote plasma formed using 3 kW power at a pressure of about 1.5 Torr.

In some embodiments, it is preferred to avoid nitridation of metal during deposition of silicon oxide, and the deposition process is conducted such as to prevent such nitridation. For example, in some embodiments, nitrogen-containing reagents are not present in contact with the substrate at least during steps that involve plasma treatment, and, in some embodiments, throughout the process. Inadvertent nitridation of metal can increase the resistance of the conductive lines and negatively affect the RC delay.

Provided methods can be used in fabrication of memory/logic devices and in a variety of other applications. The methods allow for uniform and conformal deposition of silicon carbide over substrates having exposed metals and dielectrics, and, independently, or in conjunction with this method, for depositing silicon oxide over metal without causing metal oxidation. Process conditions were identified, where metal is not oxidized (or, if oxidized, is then reduced back to metal in zero oxidation state), while a silicon-containing precursor is oxidized to form silicon oxide.

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. In some embodiments the apparatus includes a system controller having program instructions to perform the method steps provided in FIG. 2 or in FIG. 3. Machine-readable media containing instructions for controlling process operations in accordance with the disclosed implementations may be coupled to the system controller. The apparatus for depositing silicon oxide can include a remote or direct plasma source. A remote plasma source is preferred in some embodiments as remote plasma may minimize the harsh reaction conditions otherwise caused by a direct plasma.

Hardware for accomplishing the deposition process operations may include atomic layer deposition (ALD) processing chambers. In some embodiments all operations of silicon oxide formation are performed in a single process chamber. In other implementations the substrate may be transferred from chamber to chamber to perform different steps of the method. For example, the substrate may be pre-cleaned in a pre-clean chamber and then may be transferred to an ALD chamber for silicon oxide deposition. Machine-readable media containing instructions for controlling process operations in accordance with the disclosed implementations may be coupled to the system controller.

In some embodiments the deposition is conducted in a plasma enhanced atomic layer deposition (PEALD) reactor which is a part of a Vector Excel deposition module available from Lam Research Corp. of Fremont, Calif. In some embodiments deposition of silicon carbide is conducted in the same process chamber as the deposition of silicon oxide. In some embodiments these depositions can be performed in separate stations of a single process chamber.

Figure 4:
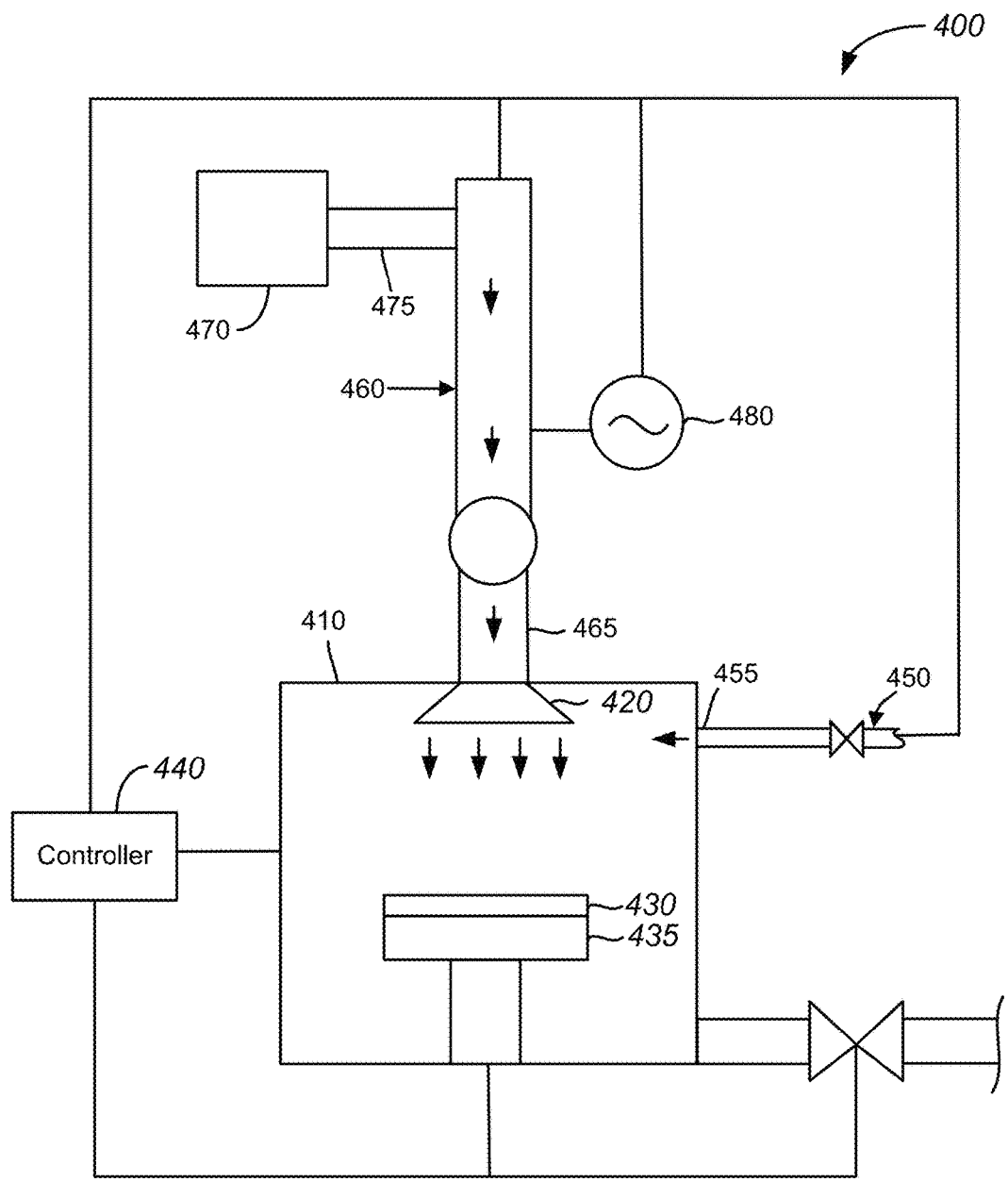
FIG. 4 is a schematic presentation of an ALD process station that can be used for deposition of silicon oxide films according to an embodiment provided herein.

FIG. 4 illustrates a schematic diagram of a remote plasma apparatus that is suitable for depositing silicon oxide according to certain embodiments. The apparatus 400 includes a reaction chamber 410, a remote plasma source 460, a silicon precursor gas delivery source 450, and a showerhead assembly 420. Inside the reaction chamber 410, a substrate 430 rests on a stage or pedestal 435. In some embodiments, the pedestal 435 can be fitted with a heating/cooling element. A controller 440 may be connected to the components of the apparatus 400 to control the operation of the apparatus 400. For example, the controller 440 may contain instructions for controlling process conditions for the operations of the apparatus 400, such as the temperature process conditions and/or the pressure process conditions.

During operation, gases or gas mixtures are introduced into the reaction chamber 410 via one or more gas inlets coupled to the reaction chamber 410. A precursor gas delivery source 450 may include a gas inlet 455 coupled to the reaction chamber 410 for the delivery of silicon-containing precursor gases. A second gas inlet 465 may be coupled to the reaction chamber 410 via the showerhead assembly 420 and connected to a remote plasma source 460. The second gas inlet 465 may be connected to the showerhead assembly 420 for the delivery of radicals formed in a plasma in a process gas having an oxygen source and $H_2$. The second gas inlet 465 may be connected to a vessel 470 which provides the process gas for the radical species. In embodiments including remote plasma configurations, the delivery lines for the precursors and the radical species generated in the remote plasma source 460 are separated. Hence, the precursors and the radical species do not substantially interact before reaching the substrate 430.

One or more radical species may be generated in the remote plasma source 460 and configured to enter the reaction chamber 410 via the second gas inlet 465. Any type of plasma source may be used in the remote plasma source 460 to create the radical species. This includes, but is not limited to, capacitively coupled plasmas, microwave plasmas, DC plasmas, inductively coupled plasmas, and laser-created plasmas. An example of a capacitively coupled plasma can be a radio-frequency (RF) plasma. A high-frequency plasma can be configured to operate at 13.56 MHz or higher. An example of such a remote plasma source 460 can be the GAMMA®, manufactured by Lam Research Corporation of Fremont, Calif. Another example of such a RF remote plasma source 460 can be the Aston®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 460, such as the Astex®, also manufactured by MKS Instruments. A microwave plasma can be configured to operate at a frequency of 2.45 GHz.

The remote plasma source 460 may include a plasma dome or other shape to form a volume for delivering the source gas from the vessel 450. Examples of remote plasma sources may be described in U.S. Pat. Nos. 8,084,339 and 8,217,513 which are incorporated herein by reference in their entirety for all purposes. In some embodiments, the remote plasma source 460 may include an inlet 475 connected to the vessel 470 with a plurality of holes configured to distribute the source gas into the internal volume of the remote plasma source 460.

When the source gas enters the remote plasma source 460, a plasma may be generated using the radio-frequency (RF) coils (not shown), which may be connected to an RF source 480 via a matching network. The plasma may generate radical species which flow through a plurality of holes in the showerhead assembly 420 from the second gas inlet 465 to distribute the radical species into the reaction chamber 410.

The controller 440 may contain instructions for controlling process conditions and operations in accordance with the present invention for the apparatus 400. The controller 440 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 440 or they may be provided over a network. Machine-readable media containing instructions for controlling process operations in accordance with the present invention may be communicatively coupled to the controller 440.

Figure 5:
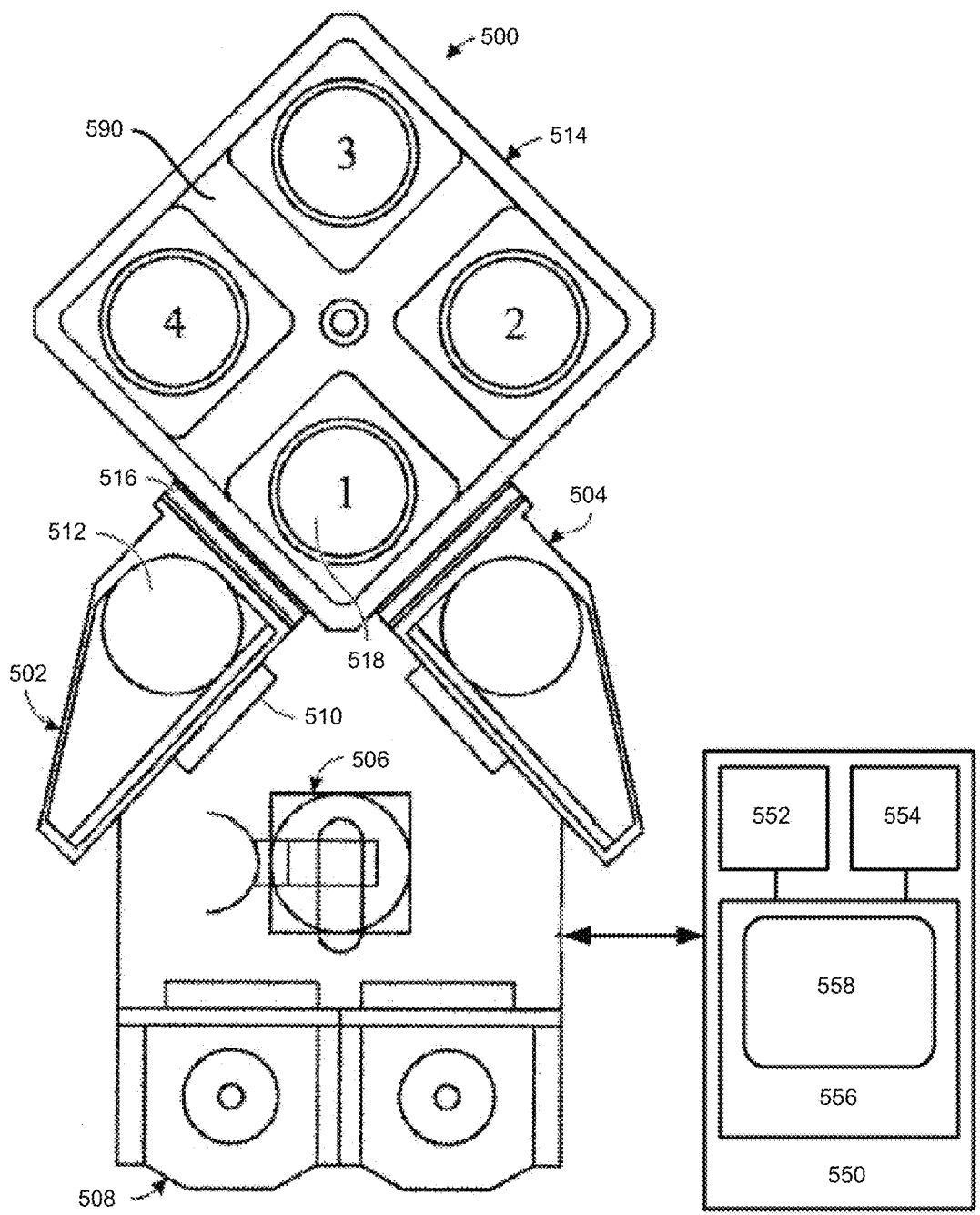
FIG. 5 shows a schematic view of a multi-station processing tool according to an embodiment provided herein.

In some embodiments, the substrates provided herein are processed in a multi-station tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. While the depicted processing chamber 514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. System control software 558 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 500. System control software 558 may be configured in any suitable way. For example, various process tool component subroutines or control objects may be written to control operation of the process tool components necessary to carry out various process tool processes in accordance with the disclosed methods. System control software 558 may be coded in any suitable computer readable programming language.

In some embodiments, system control software 558 may include input/output control (IOC) sequencing instructions for controlling the various parameters described above. For example, each phase of an ALD process may include one or more instructions for execution by system controller 550. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 6:
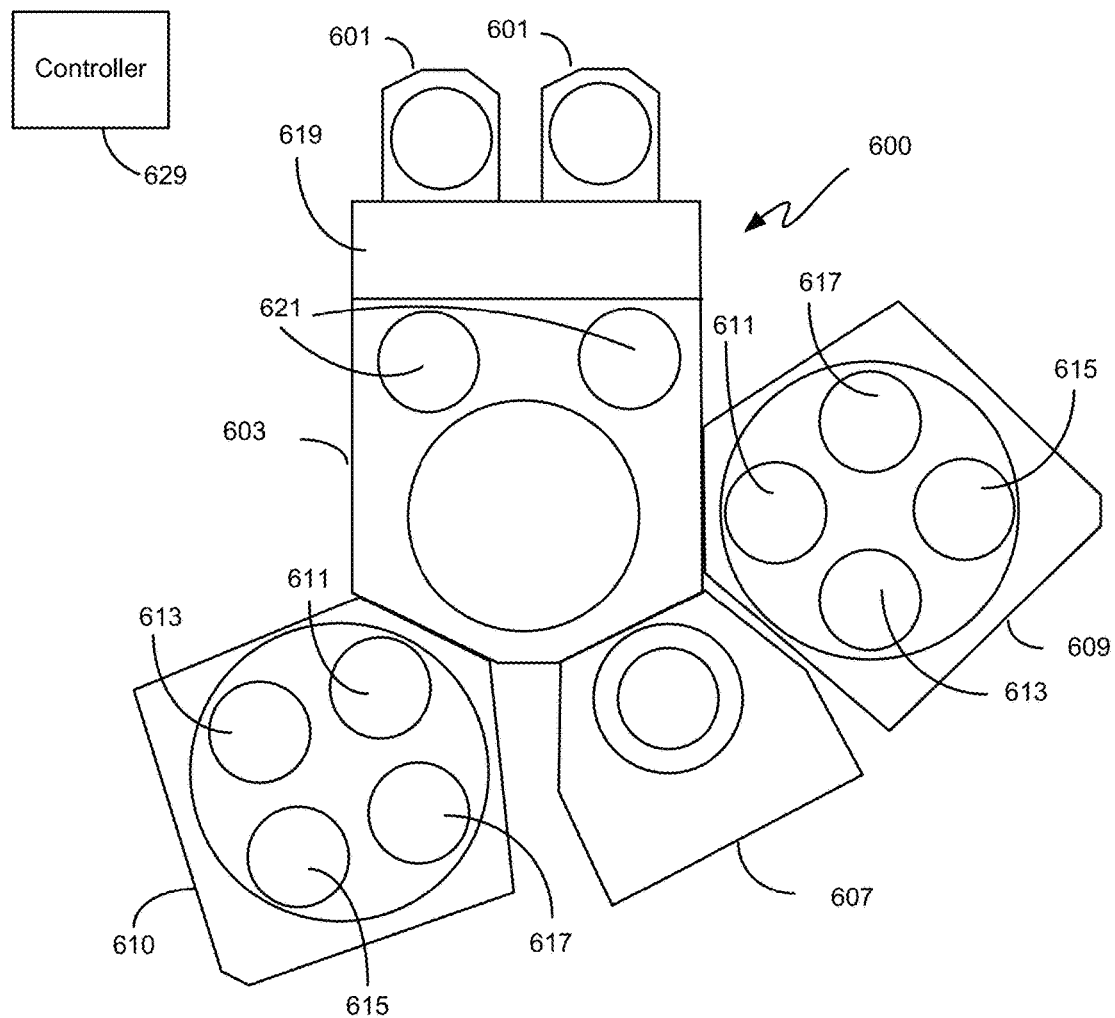
FIG. 6 is a block diagram of a processing tool configured for depositing films according to an embodiment provided herein.

FIG. 6 is a block diagram of a processing system suitable for conducting thin film deposition processes in accordance with certain embodiments. The system 600 includes a transfer module 603. The transfer module 603 provides a clean, pressurized environment to minimize risk of contamination of substrates being processed as they are moved between various reactor modules. Mounted on the transfer module 603 are two multi-station reactors 609 and 610, each capable of performing atomic layer deposition (ALD) according to certain embodiments. Reactors 609 and 610 may include multiple stations 611, 613, 615, and 617 that may sequentially or non-sequentially perform operations in accordance with disclosed embodiments. The stations may include a heated pedestal or substrate support, one or more gas inlets or showerhead or dispersion plate.

Also mounted on the transfer module 603 may be one or more single or multi-station modules 607 capable of performing plasma or chemical (non-plasma) pre-cleans, or any other processes described in relation to the disclosed methods. The module 607 may in some cases be used for various treatments to, for example, prepare a substrate for a deposition process. The module 607 may also be designed/configured to perform various other processes such as etching or polishing. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. Such processing may be employed, for example, to pattern the dielectric layers on which the tantalum nitride, tantalum, and/or copper layers are deposited, as described above.

Experimental Results

Figure 7:
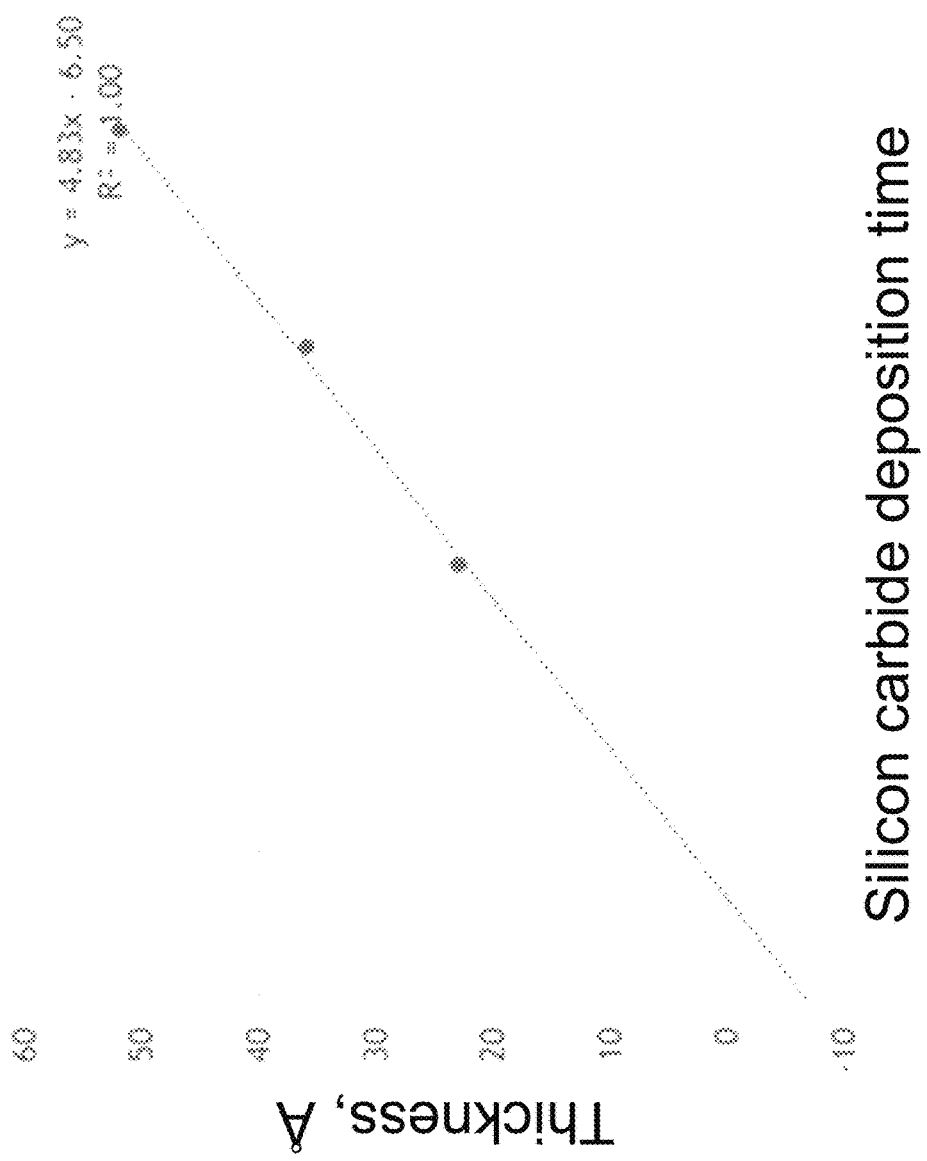
FIG. 7 is an experimental plot illustrating thickness of silicon carbide deposited on a tungsten layer as a function of deposition time.

1. Nucleation delay. The problem of nucleation delay during deposition of silicon carbide on tungsten is illustrated in the plot shown in FIG. 7. Silicon carbide was deposited on a substrate containing an exposed tungsten layer. The thickness of deposited silicon carbide is shown as a function of deposition time. The resulting dependence is fitted with a linear function having an intercept of about 7 Å on the y-axis. The intercept corresponds to the delay in nucleation of silicon carbide on tungsten. When silicon carbide was deposited onto silicon nitride no such delay was observed.

Figure 8:
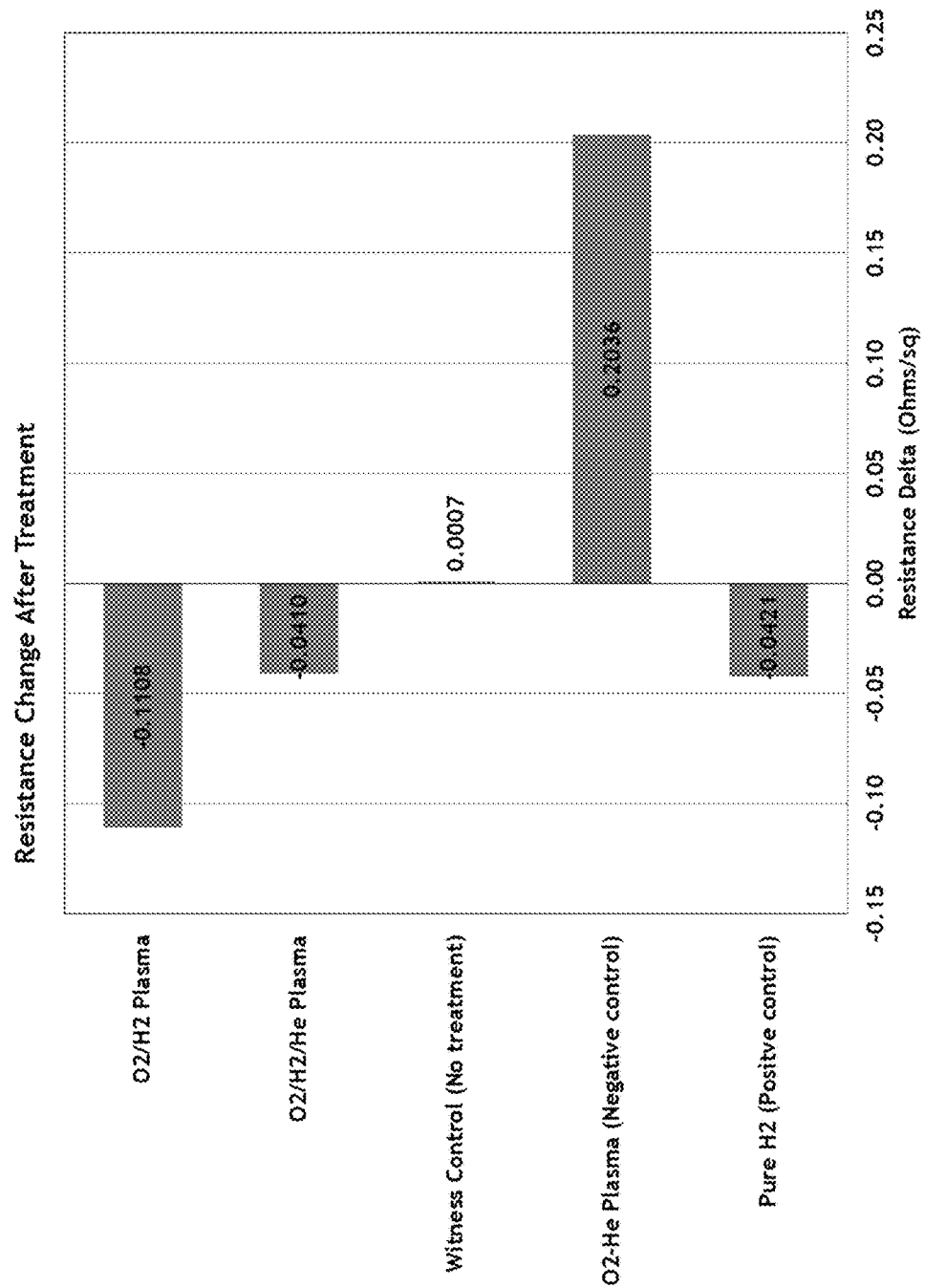
FIG. 8 is an experimental diagram illustrating tungsten resistivity after treatment with different plasmas.

2. Plasmas suppressing metal oxidation. Substrates containing an exposed tungsten layer were treated with different plasmas, and resistivity of tungsten was measured before and after treatment. Increases in resistivity are indicative of tungsten oxide formation, whereas decreases in resistivity or no change in resistivity indicate that metal oxide was not forming under selected conditions. Results are provided in FIG. 8. All substrates, with the exception of an untreated control substrate were treated with a remotely formed plasma, where plasma was generated using a 3 kW power level at a 13.56 MHz frequency. The first sample was treated with a plasma formed in a mixture of $O_2$ and $H_2$, where the concentration of $O_2$ was 0.1 volume % (with the rest being hydrogen). The resistivity of treated tungsten decreased indicating that this treatment suppresses metal oxidation and does not generate tungsten oxide. The second sample was treated with a plasma formed in a mixture of $O_2$, $H_2$, and He, where the concentration of $O_2$ was 0.1 volume %, the concentration of $H_2$ was 2 volume % (with the rest being helium). The resistivity of treated tungsten also decreased indicating that this treatment also suppresses metal oxidation and does not generate tungsten oxide. The third sample was a control untreated sample, which, as expected, did not provide any substantial change in resistivity. The fourth sample was a control sample that was treated with a plasma formed in a mixture of $O_2$ and He (with no other gasses present). This sample, as expected, showed an increase in resistivity due to tungsten oxidation. The fifth sample is a control sample that was treated with a plasma formed in pure $H_2$ (with no other gasses present). This sample, as expected, showed a decrease in resistivity.

3. Deposition of silicon oxide. Silicon oxide layer was deposited on a substrate using ALD, as provided herein, where each ALD cycle included oxidizing the adsorbed silicon-containing precursor (bis(dimethylamino)methylsilane) with a plasma formed in a mixture of $O_2$, $H_2$ and He, with low $O_2$ content as provided herein. After a plurality of ALD cycles, refractive index of the substrate was measured, and was 1.4546. This refractive index corresponds to silicon oxide and is indicative of successful silicon oxide formation. The deposition rate was 1.06 Å/cycle. In a control experiment, silicon oxide layer was deposited by ALD using the same silicon-containing precursor, but with a plasma formed in a mixture of $O_2$ and He. After five ALD cycles, refractive index of the substrate was measured, and was 1.4401. The deposition rate was 1.43 Å/cycle. In both experiments, silicon oxide was deposited with excellent within wafer non-uniformity.

4. Silicon oxide was deposited by ALD on a substrate having an exposed W layer and an exposed dielectric layer, using methods provided herein. Silicon carbide was then formed over silicon oxide and the thickness of silicon carbide was measured over metal and over dielectric. The thickness was substantially the same over dielectric and metal, indicating that silicon oxide layer addressed a problem of nucleation delay over tungsten.

What is claimed is:

1. A method for processing a semiconductor substrate, the method comprising:
    (a) providing a semiconductor substrate comprising an exposed metal layer; and
    (b) forming a silicon oxide layer over and in contact with the metal layer, wherein forming the silicon oxide layer comprises reacting a silicon-containing precursor adsorbed to the metal layer with a plasma formed in a process gas comprising $H_2$ and an oxygen source, wherein the composition of the process gas is configured for suppressing oxidation of the metal layer, and
    (c) contacting the semiconductor substrate having an exposed silicon oxide layer after (b) with a reducing plasma to reduce residual metal oxide underlying the silicon oxide layer to metal.

2. The method of claim 1, wherein the volume ratio of $H_2$ to the oxygen source in the process gas is at least 4:1.

3. The method of claim 1, wherein the oxygen source is $O_2$, and wherein the volume ratio of $H_2$ to $O_2$ in the process gas is at least 9:1.

4. The method of claim 1, wherein the oxygen source is $O_2$, and wherein the volume ratio of $H_2$ to $O_2$ in the process gas is at least 10:1.

5. The method of claim 1, wherein the oxygen source is $O_2$, and wherein the process gas consists essentially of $H_2$ at a concentration of between about 2-10%, $O_2$ at a concentration of less than 1%, and an inert gas.

6. The method of claim 1, wherein the oxygen source is $O_2$, and wherein the process gas consists essentially of $H_2$ at a concentration of greater than about 95% and $O_2$ at a concentration of less than about 5%.

7. The method of claim 1, wherein the oxygen source is selected from the group consisting of $O_2$, $O_3$, $CO_2$ and $N_2O$.

8. The method of claim 1, wherein the oxygen source is $O_2$.

9. The method of claim 1, wherein the metal is selected from the group consisting of W, Cu, Co, Ti, and Ta.

10. The method of claim 1, wherein the metal is W.

11. The method of claim 1, wherein (b) comprises:
    (i) contacting the semiconductor substrate with the silicon-containing precursor and adsorbing the silicon-containing precursor on the layer of metal;
    (ii) removing the unadsorbed silicon-containing precursor by purging and/or evacuating a process chamber housing the semiconductor substrate;
    (iii) contacting the semiconductor substrate with the plasma formed in the process gas comprising $H_2$ and the oxygen source and forming silicon oxide from the adsorbed silicon-containing precursor;
    (iv) purging and/or evacuating the process chamber after (iii); and
    (v) repeating steps (i) (iv).

12. The method of claim 1, further comprising pre-cleaning the exposed metal layer to remove metal oxide from the exposed metal layer prior to (b).

13. The method of claim 1, wherein the silicon oxide is formed in (b) to a thickness of less than about 10 Å.

14. The method of claim 1, wherein the silicon oxide is formed in (b) to a thickness of about 5 Å.

15. The method of claim 1, further comprising:
applying photoresist to the semiconductor substrate;
exposing the photoresist to light;
patterning the photoresist and transferring the pattern to the semiconductor substrate; and
selectively removing the photoresist from the semiconductor substrate.

16. The method of claim 1, wherein (b) further comprises reducing a metal oxide formed on the metal layer to metal.

17. The method of claim 1, wherein the semiconductor substrate provided in (a) comprises a plurality of recessed features and further comprises an exposed dielectric layer, and wherein the silicon oxide is formed both on the exposed metal layer and the exposed dielectric layer.

18. The method of claim 17, further comprising depositing a silicon carbide layer onto the silicon oxide layer.

* * * * *